(12) United States Patent
Hansen

(10) Patent No.: US 11,254,215 B2
(45) Date of Patent: Feb. 22, 2022

(54) ISOLATION RESISTANCE MEASUREMENT OF POWER SYSTEM IN VEHICLE

(71) Applicant: Volvo Car Corporation, Gothenburg (SE)

(72) Inventor: Søren Kolbach Hansen, Gothenburg (SE)

(73) Assignee: Volvo Car Corporation, Gothenburg (SE)

( * ) Notice: Subject to any disclaimer, the term of this patent is extended or adjusted under 35 U.S.C. 154(b) by 175 days.

(21) Appl. No.: 16/684,498

(22) Filed: Nov. 14, 2019

(65) Prior Publication Data

US 2020/0156477 A1 May 21, 2020

Related U.S. Application Data

(60) Provisional application No. 62/770,274, filed on Nov. 21, 2018.

(51) Int. Cl.
*B60L 3/00* (2019.01)
*G01R 31/50* (2020.01)
*G01R 31/00* (2006.01)

(52) U.S. Cl.
CPC ............ *B60L 3/0069* (2013.01); *G01R 31/50* (2020.01); *G01R 31/007* (2013.01)

(58) Field of Classification Search
CPC ..... B60L 3/0069; G01R 31/50; G01R 31/007; G01R 31/52; G01R 31/006; G01R 27/025
USPC ......................................... 324/509, 503, 500
See application file for complete search history.

(56) References Cited

U.S. PATENT DOCUMENTS

| 2007/0013382 | A1* | 1/2007 | Hinz | ...................... B60L 58/34 324/500 |
| 2009/0323233 | A1* | 12/2009 | Shoemaker | .......... G01R 31/005 361/42 |
| 2011/0115490 | A1 | 5/2011 | Klijn | |
| 2013/0278272 | A1* | 10/2013 | Kaminski | .............. G01R 27/18 324/510 |
| 2013/0300430 | A1* | 11/2013 | Lindsay | .................. B60L 50/51 324/522 |
| 2014/0084934 | A1* | 3/2014 | Bober | .................. G01R 27/025 324/434 |

(Continued)

OTHER PUBLICATIONS

Response to Extended Search Report dated Apr. 21, 2020 from counterpart European Application No. 19210065.9, filed Nov. 17, 2020, 15 pp.

(Continued)

*Primary Examiner* — Giovanni Astacio-Oquendo
(74) *Attorney, Agent, or Firm* — Shumaker & Sieffert, P.A.

(57) ABSTRACT

This disclosure describes techniques for separately determining isolation resistances from nodes of a power system of an electric vehicle (EV) to a chassis of the EV. Processing circuitry may determine a first isolation resistance between a first node of the power system in the EV and a chassis of the EV, determine a second isolation resistance between a second node of the power system in the EV and the chassis of the EV, determine that the first isolation resistance or the second isolation resistance is less than a threshold resistance, and output information based on the determination that the first isolation resistance or the second isolation resistance is less than the threshold resistance.

14 Claims, 4 Drawing Sheets

(56) References Cited

U.S. PATENT DOCUMENTS

| | | | |
|---|---|---|---|
| 2014/0266223 A1* | 9/2014 | Foley | H01M 8/04813 |
| | | | 324/426 |
| 2018/0074108 A1 | 3/2018 | Dulle et al. | |
| 2018/0267089 A1 | 9/2018 | Clauvelin et al. | |

OTHER PUBLICATIONS

Extended Search Report from counterpart European Application No. 19210065.9, dated Apr. 21, 2020, 9 pp.

* cited by examiner

ISOLATION RESISTANCE MEASUREMENT OF POWER SYSTEM IN VEHICLE

This application claims the benefit of U.S. Provisional Application No. 62/770,274, filed Nov. 21, 2018, the entire contents of which is hereby incorporated by reference.

TECHNICAL FIELD

The disclosure relates to resistance measurements in a vehicle.

BACKGROUND

A vehicle is partially, primarily, or exclusively powered by a power system, such as one or more batteries, fuel cells, and/or capacitor banks. Due to the power needs of some vehicles, the power system tends to be a high voltage or high-power power system. In some examples, the vehicle chassis (e.g., vehicle frame) forms a ground voltage level for the power system. Accordingly, the chassis of the vehicle and the power system of the vehicle should be electrically isolated.

SUMMARY

In general, the disclosure describes techniques for measuring the isolation resistance between a power system and a chassis of a vehicle. For instance, the power system may be designed with a first isolation resistance that electrically isolates a first node (e.g., having positive or negative polarity) of the power system from the chassis (e.g., limits the flow of current between the first node of the power system and the chassis), and with a second isolation resistance that electrically isolates a second node (e.g., having the other of the positive or negative polarity) of the power system from the chassis. However, it may be possible that due to debris, water, component failure, etc., that there becomes an electrical current path between the chassis and the power system. The resistance of this current path can change and possibly reduce one or both of the first isolation resistance and the second isolation resistance (e.g., by creating a current path). This disclosure describes example techniques to determine whether there is sufficient isolation between the power system and the chassis in the electrical vehicle by, for example, determining the value of both the first isolation resistance and the second isolation resistance.

In one example, the disclosure describes a method comprising determining a first isolation resistance between a first node of a power system in an electrical vehicle (EV) and a chassis of the EV, determining a second isolation resistance between a second node of the power system in the EV and the chassis of the EV, determining that the first isolation resistance or the second isolation resistance is less than a threshold resistance, and outputting information based on the determination that the first isolation resistance or the second isolation resistance is less than the threshold resistance.

In one example, the disclosure describes a system comprising processing circuitry configured to determine a first isolation resistance between a first node of a power system and a chassis of an electric vehicle (EV), determine a second isolation resistance between a second node of the power system and the chassis of the EV, determine that the first isolation resistance or the second isolation resistance is less than a threshold resistance, and output information based on the determination that the first isolation resistance or the second isolation resistance is less than the threshold resistance.

In one example, the disclosure describes a non-transitory computer-readable storage medium storing instructions thereon that when executed cause one or more processors to determine a first isolation resistance between a first node of a power system in an electrical vehicle (EV) and a chassis of the EV, determine a second isolation resistance between a second node of the power system in the EV and the chassis of the EV, determine that the first isolation resistance or the second isolation resistance is less than a threshold resistance, and output information based on the determination that the first isolation resistance or the second isolation resistance is less than the threshold resistance.

The details of one or more examples are set forth in the accompanying drawings and the description below. Other features, objects, and advantages will be apparent from the description and drawings, and from the claims.

DETAILED DESCRIPTION

Figure 1:
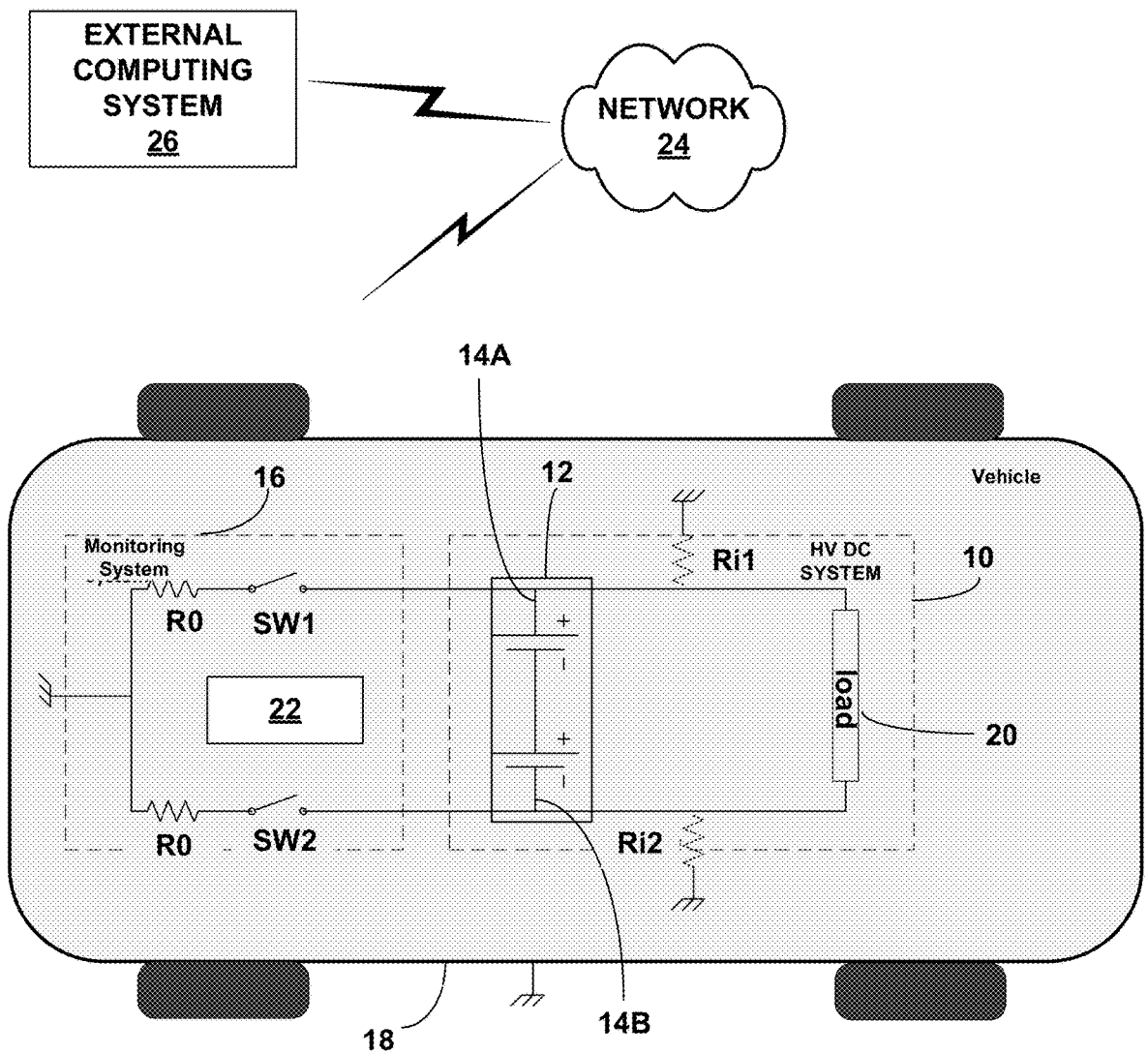
FIG. 1 is a block diagram illustrating an example power management system configured to perform one or more example techniques described in this disclosure.

In electrical vehicles (EVs), there is a requirement that the high voltage DC (HV DC) system and the chassis of the vehicle be electrical isolated from one another so that current from one or more batteries, fuel cells, and/or capacitor banks (e.g., combination of serial or parallel coupling of capacitors to store and deliver power) that form a power system do not flow to the chassis. The HV DC system is designed to have property that the HV DC system is electrically isolated from the chassis. Conceptually, this can be considered as there being certain resistance between the HV DC system and the chassis. This resistance may not necessarily be due to a physical resistor between the HV DC system and the chassis, but, rather, a physical property of the HV DC system that there be certain isolation resistance between the HV DC system and the chassis. Stated another way, to the extent there is any electrical current path between the HV DC system and the chassis, such electrical current paths should be of relatively high resistance.

For instance, the HV DC system includes a power system that includes a positive node and a negative node. Conceptually, it can be considered that there is a first isolation resistance from the positive node to the chassis, and a second isolation resistance from the negative node to the chassis.

However, there is a possibility that debris, water, component failure, etc. cause there to be a current path from the positive or negative node of the power system to the chassis. The resistance of the current path can be lower than the isolation resistance for which the system was designed, which means that the actual isolation resistance is reduced. Accordingly, a power management system may periodically (e.g., every 10 seconds) measure the isolation resistance between the power system and the chassis to ensure that the isolation resistance is greater than a threshold resistance.

To determine the isolation resistance, some techniques determine the parallel resistance between the positive node of the power system to the chassis and the negative node of the power system to the chassis. That is, the parallel resistance is the parallel combination of the resistance from each of the positive node and negative node of the power system to the chassis. In such techniques, there is a single resistance value that indicates the isolation resistance. Such techniques may be deficient because if there becomes a lower resistance current path, it is unknown whether the current path is from the positive node of the power system to the chassis or the negative node of the power system to the chassis.

This disclosure describes example techniques to determine the isolation resistance for the positive node, and separately determine the isolation resistance for the negative node. If at least one of the isolation resistances is less than a threshold resistance, the power management system may output information indicating that the isolation resistance for at least one of the positive node or the negative node does not satisfy the threshold (e.g., is below the threshold), and in some examples, specify whether the isolation resistance for the positive node or the isolation resistance for the negative node is below the threshold allowing for ease of diagnosis.

FIG. 1 is a block diagram illustrating an example power management system configured to perform one or more example techniques described in this disclosure. For instance, FIG. 1 illustrates a vehicle that includes power management system 10 (also called HV DC system 10) that includes power system 12 having a positive node 14A and a negative node 14B, electrical control unit (ECU) 16 (also called monitoring system 16) that includes processing circuitry 22, resistor R0 and switches SW1 and SW2, chassis 18, and load 20. Chassis 18 may be the metal housing of the electrical vehicle (EV) that includes power management system 10. In FIG. 1, chassis 18 is shown as being the ground potential. In FIG. 1, the illustrated ground potentials may be electrically coupled together.

Processing circuitry 22 may represent one or more processors implemented as fixed-function processing circuits, programmable processing circuits, or a combination thereof. Fixed-function circuits refer to circuits that provide particular functionality and are pre-set on the operations that can be performed. Programmable circuits refer to circuits that can programmed to perform various tasks and provide flexible functionality in the operations that can be performed. For instance, programmable circuits may execute software or firmware that cause the programmable circuits to operate in the manner defined by instructions of the software or firmware. Fixed-function circuits may execute software instructions (e.g., to receive parameters or output parameters), but the types of operations that the fixed-function processing circuits perform are generally immutable. In some examples, the one or more processing circuits may be distinct circuit blocks (fixed-function or programmable), and in some examples, the one or more circuits may be integrated circuits.

Power system 12 may be one or more high voltage DC batteries, fuel cells, and/or capacitor banks having a regulator or some other circuitry that can generate a range of DC voltage levels that power load 20 to drive the vehicle. As one example, power system 12 includes positive node 14A and negative node 14B. Positive node 14A and negative node 14B may be the outputs of the regulator circuit or some other circuit and the voltage level between positive node 14A and negative node 14B can be approximately 400 V and can change based on whether EV is speeding or slowing down, as two example factors.

FIG. 1 also illustrates resistances Ri1 and Ri2. Resistances Ri1 and Ri2 are conceptually shown as resistors that provide electrical isolation between positive node 14A to chassis 18 and negative node 14B to chassis 18. Ri1 and Ri2 are not necessarily physical resistors (although possible) and are property of power management system 10. For instance, resistances Ri1 and Ri2 illustrate resistance of a "possible current path" between positive node 14A and negative node 14B, respectively, to chassis 18. This possible current path may not be an actual current path through which current flows due to its high resistance, and should be considered as a conceptual current path. The first isolation resistance is between positive node 14A and chassis 18, and the second isolation resistance is between negative node 14B and chassis 18.

In some examples, Ri1 and Ri2 may be approximately 5 mega-ohms. However, there may be possibility that due to debris, water, component failure, etc. that Ri1 and Ri2 are reduced. Accordingly, ECU 16 (e.g., via processing circuitry 22) may be configured to periodically (e.g., every 10 seconds) determine a first isolation resistance between positive node 14A to chassis 18 and determine a second isolation resistance between negative node 14B to chassis 18. ECU 16 may determine whether the first isolation resistance or the second isolation resistance is less than a threshold resistance (e.g., less than 2.5 mega-ohms), and, if ECU 16 determines that the first isolation resistance or the second isolation resistance is less than the threshold resistance, output information indicating that at least one of the first isolation resistance or the second isolation resistance is less than the threshold resistance.

There may be various ways in which ECU 16 (e.g., via processing circuitry 22) may determine whether the first isolation resistance or the second isolation resistance is less than a threshold resistance. As one example, ECU 16 may compare a value representative of the first isolation resistance to a value representative of the threshold resistance and compare a value representative of the second isolation resistance to a value representative of the threshold resistance. A value representative of the first isolation resistance, the second isolation resistance, and the threshold resistance may be the actual values of the first isolation resistance, the second isolation resistance, and the threshold resistance, or an offset, inverted, or scaled version of the first isolation resistance, the second isolation resistance, and the threshold resistance.

For instance, assume that the value representative of the first isolation resistance and the threshold resistance is the actual value of the first isolation resistance and the threshold resistance. In this case, if ECU 16 determines that the actual value of the first isolation resistance is less than the actual value of the threshold resistance, ECU 16 may determine that the first isolation resistance is less than a threshold resistance. As another example, assume that the value representative of the first isolation resistance is the inverse of the actual value of the first isolation resistance (e.g., 1/(actual value of the first isolation resistance)), and that the value representative of the threshold resistance is also an inverted value. In this case, if ECU 16 determines that the inverse of the actual value of the first isolation resistance is greater than the value representative of the threshold resistance, ECU 16 may determine that the first isolation resistance is less than a threshold resistance. There may be many ways to offset, invert, scale, etc. the actual values of the first isolation resistance and the second isolation resistance for the comparison to a value representative of the threshold resistance, and the techniques described in the disclosure contemplate such various ways to perform the comparisons.

In some examples, ECU 16 may be configured to determine which one or both of the first isolation resistance and the second isolation resistance is less than the threshold resistance. Some other techniques determine an overall resistance value based on the first isolation resistance and the second isolation resistance (e.g., parallel resistance value of the first isolation resistance and the second isolation resistance). However, in such techniques, it may be unknown whether the first isolation resistance or the second isolation resistance reduced. For instance, ECU 16 may not be able to determine whether the isolation resistance between positive node 14A to chassis 18 was reduced, or whether the isolation resistance between negative node 14B to chassis 18 was reduced.

With the example techniques described in this disclosure, ECU 16 may be configured to separately determine the first isolation resistance and the second isolation resistance. In this manner, any reduction in isolation resistance may be more easily diagnosed, as compared to using a parallel resistance value.

Figure 2A:
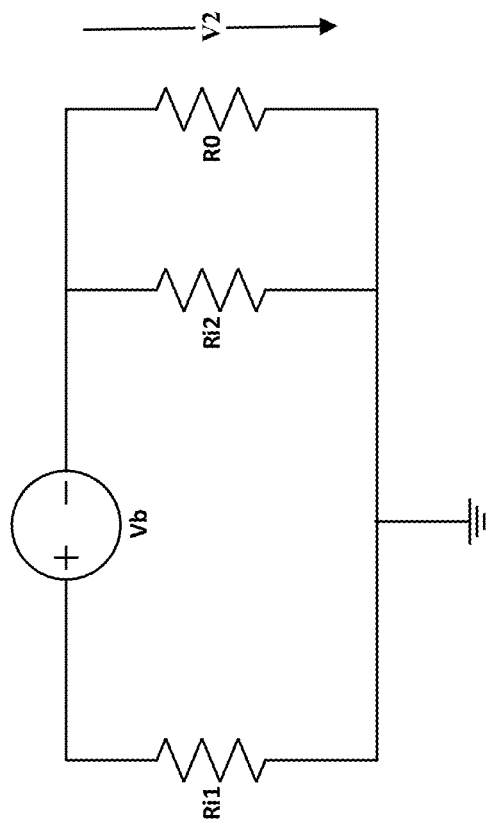
FIG. 2A is a block diagram illustrating a first configuration at a first time instance of an isolation resistance measurement circuit.
Figure 2B:
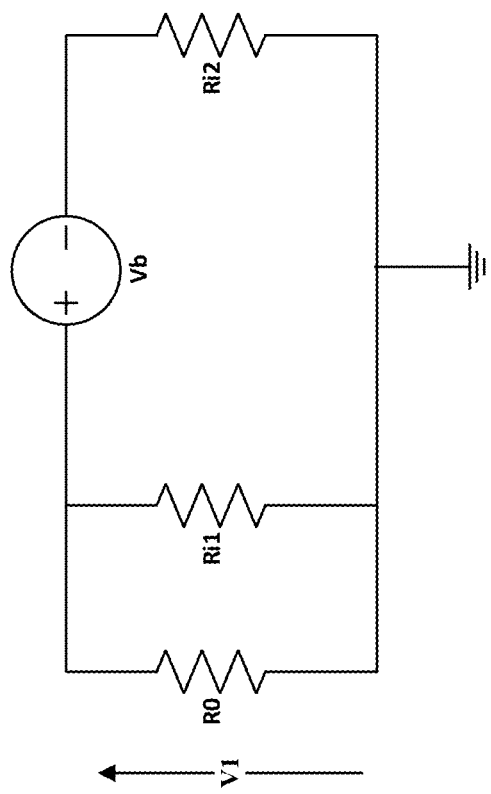
FIG. 2B is a block diagram illustrating a second configuration at a second time instance of an isolation resistance measurement circuit.

For instance, ECU 16 (or monitoring system 16) is illustrated as including a first resistor R0 coupled to switch SW1 that couples to positive node 14A and a second resistor R0 coupled to switch SW2 that couples to negative node 14B. In a first time instance, processing circuitry 22 of ECU 16 closes switch SW1 and leaves switch SW2 open so that first resistor R0 is parallel with Ri1. In a second time instance, processing circuitry 22 of ECU 16 closes switch SW2 and leaves switch SW1 open so that second resistor R0 is parallel with Ri2. Examples of the first and second time instances are shown in FIGS. 2A and 2B. In the first and second time instances, processing circuitry 22 of ECU 16 may measure the voltage across first resistor R0 (in the first time instance) and across second resistor R0 (in the second time instance). Based on the voltage measurements, voltage of power system 12, and value of resistor R0, ECU 16 may separately determine the first isolation resistance and the second isolation resistance.

Although two resistors R0 are illustrated, it may be possible to use a single resistor R0 and a different combination of switches to achieve the same electrical configuration as described in this disclosure. Also, resistors R0 may not be connected to power management system 10 except for when measuring the isolation resistances.

In one or more examples, processing circuitry 22 may compare the first isolation resistance to a threshold resistance to determine whether the first isolation resistance is greater than or equal to the threshold resistance or less than the threshold resistance. Processing circuitry 22 may similarly compare the second isolation resistance to the threshold resistance to determine whether the second isolation resistance is greater than or equal to the threshold resistance or less than the threshold resistance. In some examples, the threshold resistance to which the second isolation resistance is compared may be different than the threshold resistance to which the first isolation resistance is compared, and in some examples, the threshold resistance to which the second isolation resistance is compared may be the same as the threshold resistance to which the first isolation resistance is compared. Based on the comparison, processing circuitry 22 may output information indicative of whether the first isolation resistance or the second isolation resistance, and in some examples, which one of the first isolation resistance or the second isolation resistance, is less than the threshold resistance.

In some examples, processing circuitry 22 may output the information indicative of whether the first isolation resistance or the second isolation resistance, and in some examples, which one of the first isolation resistance or the second isolation resistance, is less than the threshold resistance to an on-board computing system of the vehicle. The on-board computing system may locally store the information or output the information to an on-board display system of the vehicle. In examples where the on-board computing system locally stores the information, processing circuitry 22 may be configured to output the stored information at a later time, such as upon request from a mechanic or sent by wireless communication as described below.

If the information indicative of whether the first isolation resistance or the second isolation resistance, and in some examples, which one of the first isolation resistance or the second isolation resistance, is less than the threshold resistance indicates that the first isolation resistance or the second isolation resistance is less than the threshold resistance, processing circuitry 22 may output information that one or both, and possibly which one, of the first and second resistances, are less than the threshold resistance. As one example, processing circuitry 22 may output an alert (e.g., on the on-board display system) or may output an alert to external computing system 26 via network 24.

The vehicle may be communicatively coupled to external computing system 26 via network 24. Also, components of external computing system 26 may communicate with one another via network 24. Network 24 may represent any type of network by which communication between the vehicle and external computing system 26 may be accomplished. Network 24 may represent a public network (e.g., the Internet), a private network, a cellular network (including various cellular data networks, such as a 3G, 4G and/or 5G network), a personal area network, or combinations thereof.

External computing system 26 may represent one or more devices configured to communicate via network 24 with the vehicle. Examples of external computing system 26 include, but are not limited to, servers, distributed computing systems (e.g., cloud-based computing systems), desktop computers, laptop computers, smart phones, tablets, etc. External computing system 26 may communicate via network 24 with the vehicle to monitor or otherwise retrieve data from one or more components of the vehicle, such as a navigation system, an infotainment system, an anti-lock braking system (ABS), a traction control (TC) system, an electronic stability control (ESC) system, a friction probing system, or any other component or system integrated into the vehicle or in communication with the vehicle. External computing system 26 may, in addition or as an alternative to monitoring the vehicle, communicate with the vehicle to update one or more of the above noted components of the vehicle.

In some examples, external computing system 26 may be a plurality of devices such as a server device and a smart phone. Processing circuitry 22 may output information indicative of whether, and which one of, the first or second isolation resistances are less than the threshold resistance to the server via network 24. The server may then output to the smart phone of a user (e.g., owner) of the vehicle information that indicates that the user should take the vehicle in to a service center for repair. A mechanic may be able to access the memory of the vehicle and retrieve information indicative of which one of the first and second resistances is less than the threshold resistance, as outputted and stored by processing circuitry 22.

The above examples are described with respect to ECU 16 including processing circuitry 22, power system 12, and the vehicle. In some examples, a system configured to perform the example techniques may include processing circuitry 22. For instance, in such an example, processing circuitry 22 may be configured to determine a first isolation resistance between a first node of power system 12 and a chassis 18 of an electric vehicle (EV), determine a second isolation resistance between a second node of the power system 12 and the chassis 18 of the EV, determine that the first isolation resistance or the second isolation resistance is less than a threshold resistance, and output information based on the determination that the first isolation resistance or the second isolation resistance is less than the threshold resistance.

In some examples, the system may further include pole resistor R0 and switches SW1 and SW2. In some examples, the system may further include pole resistor R0, switches SW1 and SW2, and power system 12. In some examples, the system may further include pole resistor R0, switches SW1 and SW2, power system 12, and the EV. That is, the example techniques described in this disclosure are described with respect to a plurality of example systems. For instance, a first example of the plurality of example systems includes processing circuitry 22, a second example of the plurality of example systems includes processing circuitry 22, pole resistor R0, and switches SW1 and SW2, a third example of the plurality of example systems includes processing circuitry 22, pole resistor R0, switches SW1 and SW2, and power system 12, and a fourth example of the plurality of example systems includes processing circuitry 22, pole resistor R0, switches SW1 and SW2, power system 12, and chassis 18. The first, second, third, and fourth example systems are described simply to ease with understanding and should not be considered limiting. Other combination of components, including additional or fewer components, may be possible and are contemplated as examples of the plurality of example systems.

FIG. 2A is a block diagram illustrating a first configuration at a first time instance of an isolation resistance measurement circuit (e.g., combination of monitoring system and parts of HV DC system as illustrated in FIG. 1). FIG. 2B is a block diagram illustrating a second configuration at a second time instance of an isolation resistance measurement circuit. "Isolation resistance measurement circuit" is used to describe components that are used to determine the isolation resistance. As one example, the isolation resistance circuit includes power system 12, processing circuitry 22, SW1, SW2, and R0. As described in more detail, pole resistor R0 and measurements of voltage V1 and V2 are used to determine the isolation resistances.

In FIGS. 2A and 2B, Ri1 and Ri2 represent the isolation resistances as shown in FIG. 1. Vb is the voltage of power system 12 (e.g., the potential between positive node 14A to negative node 14B). The + sign in Vb corresponds to positive node 14A, and the − sign in Vb corresponds to negative node 14B. The ground symbol in FIGS. 2A and 2B is chassis 18. R0, similar to R0 of FIG. 1, is a pole resistor used to determine first and second isolation resistances. As one example, R0 may be approximately 500 kilo-ohms.

When determining the isolation resistance, processing circuitry 22 of ECU 16 may configure the isolation resistance measurement circuit in a first configuration at a first time instance (e.g., by closing switch SW1 and leaving open switch SW2), as shown in FIG. 2A. ECU 16 may wait for the circuit to settle (e.g., so that there are no time-varying signal portions). As one example, processing circuitry 22 of ECU 16 may wait a few seconds (e.g., 4-5 seconds) or in the order of milliseconds. In the first configuration, processing circuitry 22 of ECU 16 may measure a first voltage (e.g., V1). As illustrated, in the first configuration, resistor R0 is parallel with the first isolation resistance (e.g., Ri1).

Processing circuitry 22 of ECU 16 may then configure the isolation resistance measurement circuit in a second configuration at a second time instance after the first time instance (e.g., by closing switch SW2 and leaving open switch SW1), as shown in FIG. 2B. Processing circuitry 22 of ECU 16 may again wait for the circuit to settle. In the second configuration, ECU 16 may measure a second voltage (e.g., V2). As illustrated, in the second configuration, resistor R0 is parallel with the second isolation resistance (e.g., Ri2).

Based on V1, V2, Vb, and a resistance of pole resistor R0, processing circuitry 22 of ECU 16 may determine the first isolation resistance and the second isolation resistance. The first isolation resistance equals $-(R0*V1+R0*V2-R0*Vb)/V2$. The second isolation resistance equals $-(R0*V1+R0*V2-R0*Vb)/V1$. If there were no additional current paths between positive node 14A and chassis 18, then the first isolation resistance would equal the isolation resistance for which the system was designed. If there were no additional current paths between negative node 14B and chassis 18, then the second isolation resistance would be equal to the isolation resistance for which the system was designed.

However, if the first isolation resistance is less than the designed resistance, processing circuitry 22 of ECU 16 may determine that there is a current path between positive node 14A and chassis 18. If the second isolation resistance is less than the designed resistance, processing circuitry 22 of ECU 16 may determine that there is a current path between negative node 14B and chassis 18. Processing circuitry 22 of ECU 16 may determine whether the first isolation resistance and/or the second isolation resistance is less than a threshold resistance. Based on the determination, processing circuitry 22 of ECU 16 may output information indicating whether the first isolation resistance and/or second isolation resistance is less than the threshold resistance.

Some other techniques may be considered as a circuit topology that is essentially a biased voltage divider with a known total resistance between chassis 18 and the connected pole (e.g., pole resistor R0). In such cases, V1 and V2 may be determined, but these other techniques may not separately determine the isolation resistances. As described, there may be various sources of error including R0, Vb, and offset due to biasing source offset when total resistance is changed.

As mentioned above, it is possible for Vb to change (e.g., when slowing or speeding), and change in a relatively short amount of time. As also mentioned above, it may be possible for a few seconds or many milliseconds to pass between ECU 16 determining the first voltage V1 at the first time instance when the isolation resistance measurement circuit is in the first configuration and ECU 16 determining the second voltage V2 at the second time instance when the isolation resistance measurement circuit is in the second configuration. Because there is a delay in the measurements of V1 and V2, it is possible that Vb changed between when V1 was measured and when V2 was measured.

To address the possible change in Vb, processing circuitry 22 of ECU 16 may be configured to scale at least one of V1 or Vb. Changes in Vb can be compensated, as long as the Vx/Vb ratio is maintained, where Vx is V1 or V2. For example, processing circuit 22 of ECU 16 may determine a ratio between V1 and Vb after determining V1 in the first configuration. Then, processing circuitry 22 of ECU 16 may determine V2 in the second configuration, and Vb may have changed. In this example, in the equation to determine the second isolation resistance, ECU 16 may scale the value of V1 based on the ratio of V1/Vb in the first configuration or scale the value of Vb based on the ratio of V1/Vb in the first configuration.

Although the above example is described with respect to ECU 16 first configuring the isolation resistance measurement circuit in the configuration illustrated in FIG. 2A, and then configuring the isolation resistance measurement circuit in the configuration illustrated in FIG. 2B, the example techniques are not so limited. In some examples, ECU 16 may first configure the isolation resistance measurement circuit in the configuration illustrated in FIG. 2B and measure V2, and then configure the isolation resistance measurement circuit in the configuration illustrated in FIG. 2A and measure V1. In such examples, to ensure proper scaling, ECU 16 may determine the ratio of V2/Vb and update the value for V2 or Vb as described above.

Figure 3:
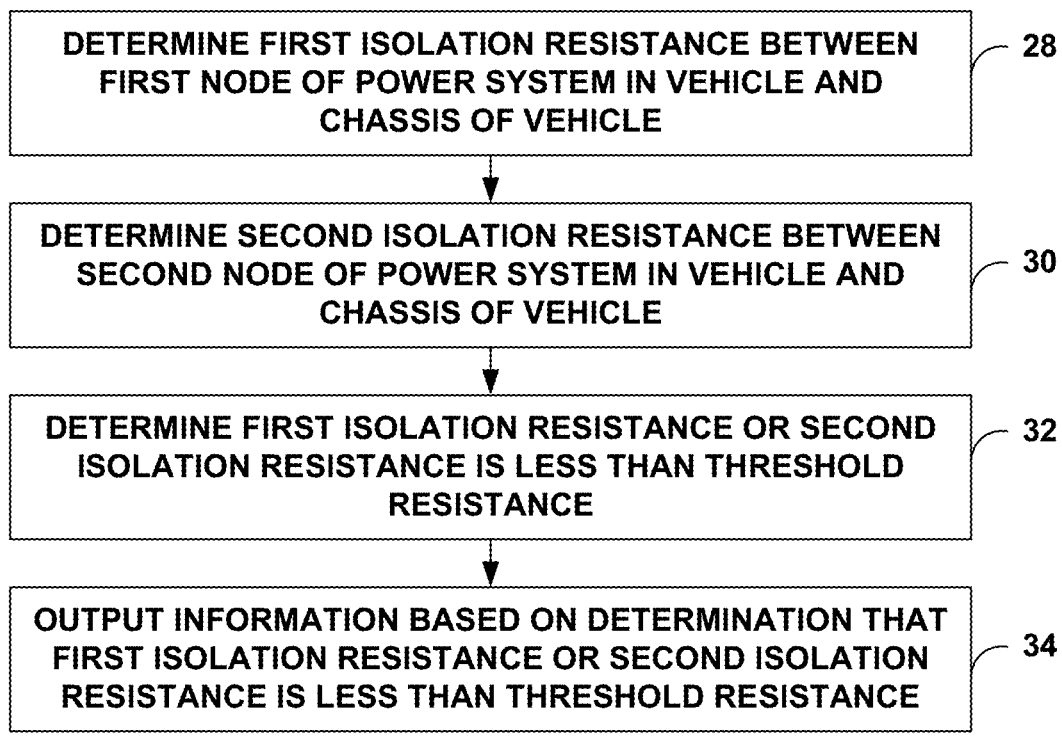
FIG. 3 is a flowchart illustrating example techniques of operation in accordance with one or more examples described in this disclosure.

FIG. 3 is a flowchart illustrating example techniques of operation in accordance with one or more examples described in this disclosure. Processing circuitry 22 of ECU 16 may determine a first isolation resistance between a first node of power system 12 in an EV and chassis 18 of the EV (28) and determine a second isolation resistance between a second node of power system 12 in the EV and chassis 18 of the EV (30). One example of the first node is node 14A or node 14B, and one example of the second node is the other one of node 14A or node 14B.

In one example, processing circuitry 22 may determine the voltage V1 or V2 by closing one of SW1 or SW2 as illustrated in FIGS. 2A and 2B and determine the other one of voltage V1 or V2 by closing the other one of SW1 or SW2. Based on V1 and V2 and the voltage of power system 12 (e.g., Vb in FIGS. 2A and 2B), processing circuitry 22 may determine first isolation resistance and the second isolation resistance as described above.

Processing circuitry 22 may be configured to determine that the first isolation resistance or the second isolation resistance is less than a threshold resistance (32). For example, processing circuitry 22 may compare the first isolation resistance to the threshold resistance to determine whether the first isolation resistance is less than the threshold resistance. Processing circuitry 22 may also compare the second isolation resistance to the threshold resistance to determine whether the second isolation resistance is less than the threshold resistance. In some examples, one or both of the first isolation resistance and the second isolation resistance may be less than the threshold resistance. In this way, processing circuitry 22 may be configured to separately determine if first isolation resistance and/or the second isolation resistance is less than the threshold resistance. For example, some other techniques determined the parallel resistance between nodes 14A and 14B to chassis 18 (e.g., a resistance value indicative of the parallel resistance of the first and second resistances). With the example techniques described in this disclosure, processing circuitry 22 may determine the first isolation resistance from node 14A to chassis 18 and the second isolation resistance from node 14B to chassis 18.

Processing circuitry 22 may output information based on the determination that the first isolation resistance or the second isolation resistance is less than the threshold resistance (34). For example, processing circuitry 22 may output information indicating whether the first isolation resistance or the second isolation resistance or both are less than the threshold resistance.

Figure 4:
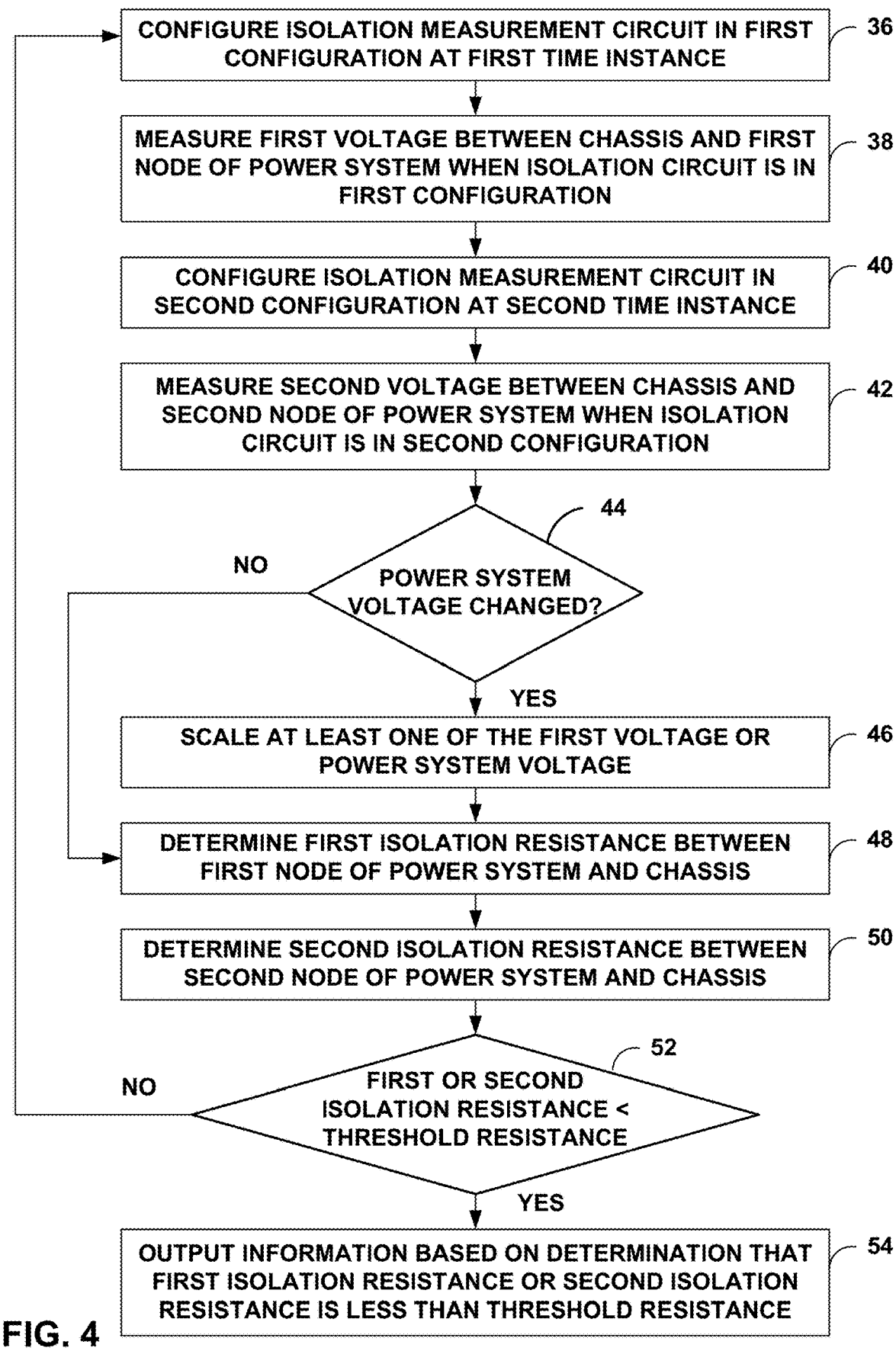
FIG. 4 is another flowchart illustrating example techniques of operation in accordance with one or more examples described in this disclosure.

FIG. 4 is another flowchart illustrating example techniques of operation in accordance with one or more examples described in this disclosure. Processing circuitry 22 may configure isolation resistance measurement circuit in a first configuration at a first time instance (36). One example of the first configuration is the example of FIG. 2A. Another example of the first configuration is the example of FIG. 2B.

Processing circuitry 22 may measure a first voltage between chassis 18 and a first node of power system 12 when the isolation circuit is in the first configuration (38). For instance, if the first configuration is the example of FIG. 2A, then the first node is node 14A and the first voltage is V1. If the first configuration is the example of FIG. 2B, then the first node is node 14B and the first voltage is V2.

Processing circuitry 22 may configure the isolation measurement circuit in a second configuration at a second time instance (40). If the example of the first configuration is the example of FIG. 2A, then the second configuration may be the example of FIG. 2B. If the example of the first configuration is the example of FIG. 2B, then the second configuration may be the example of FIG. 2A. The first and second configurations may be different from one another so as to measure different resistances.

In one or more examples, processing circuitry 22 may measure a second voltage between chassis 18 and a second node of power system 12 when the isolation circuit is in the second configuration (42). For instance, if the second configuration is the example of FIG. 2A, then the second node is node 14A and the second voltage is V1. If the second configuration is the example of FIG. 2B, then the second node is node 14B and the second voltage is V2.

As described above, in some examples, the voltage Vb of power system 12 may be change based on change in velocity between the first time instance and the second time instance. Accordingly, processing circuitry 22 may determine whether the voltage Vb changed from the first time instance to the second time instance (44).

If there is a change in the voltage Vb changed (YES of 44), processing circuitry 22 may scale at least one of the first voltage or the power system voltage (e.g., Vb) (46). Scaling one of the first voltage (e.g., V1 or V2) or the power system voltage (e.g., Vb) is provided as one example. It may be possible to scale the second voltage (e.g., other one of V1 or V2). If there is no change in the power system voltage Vb (NO of 44) or after scaling, processing circuitry 22 may determine a first isolation resistance between the first node of power system 12 and chassis 18 (48) and determine a second isolation resistance between the second node of power system 12 and chassis 18 (50). The example equations for determining the first isolation resistance and the second isolation resistance may be: (1) the first isolation resistance equals $-(R0*V1+R0*V2-R0*Vb)/V2$ and (2) second isolation resistance equals $-(R0*V1+R0*V2-R0*Vb)/V1$. In some examples, Vb, V1, or V2 may be scaled based on there being a change in the power system voltage Vb between the first time instance and the second time instance (YES of 44).

Processing circuitry 22 may determine whether the first isolation resistance or second isolation resistance (e.g., one of first or second isolation resistance or both first and second isolation resistance) is less than the threshold resistance (52). In some examples, processing circuitry 22 may compare the first and second isolation resistances to the same threshold resistance to determine whether the first isolation resistance or second isolation resistance is less than the threshold resistance. In some examples, processing circuitry 22 may compare the first and second isolation resistances to the different threshold resistances to determine whether the first isolation resistance or second isolation resistance is less than the threshold resistance (e.g., whether the first isolation resistance is less than a first threshold resistance and the second isolation resistance is less than a second threshold resistance).

Based on a determination that the first isolation or second isolation resistance is less than the threshold resistance (YES of 52), processing circuitry 22 may output information that first isolation or second isolation resistance is less than the threshold resistance (54). For example, processing circuitry 22 may output information indicative of whether the first isolation resistance or the second isolation resistance, and in some examples, which one of the first isolation resistance or the second isolation resistance, is less than the threshold resistance (e.g., to an on-board computing system and/or external computing system 26).

In some examples, if both the first isolation resistance and the second isolation resistance are greater than the threshold resistance (NO of 52), processing circuitry 22 may wait a few seconds and then redetermine whether the first isolation resistance or the second isolation resistance is less than the threshold resistance. For example, processing circuitry 22 may perform the example operations of FIG. 4. In some examples, even after outputting information that one or both of the first or second isolation resistances are less than the threshold resistance, processing circuitry 22 may redetermine whether the first isolation resistance or second isolation resistance is less than the threshold resistance (e.g., perform the example operations of FIG. 4).

The following are some examples of aspects described in this disclosure. The following examples may be performed separately or together.

Example 1: A method comprising determining a first isolation resistance between a first node of a power system in an electrical vehicle (EV) and a chassis of the EV, determining a second isolation resistance between a second node of the power system in the EV and the chassis of the EV, determining that the first isolation resistance or the second isolation resistance is less than a threshold resistance, and outputting information based on the determination that the first isolation resistance or the second isolation resistance is less than the threshold resistance.

Example 2: The method of example 1, wherein outputting information comprises outputting information indicating whether the first isolation resistance or the second isolation resistance or both are less than the threshold resistance.

Example 3: The method of any of examples 1 and 2, wherein the first node is a positive node of the power system, and the second node is a negative node of the power system.

Example 4: The method of any of examples 1 and 2, wherein the first node is a negative node of the power system, and the second node is a positive node of the power system.

Example 5: The method of any of examples 1-4, further comprising configuring an isolation resistance measurement circuit in a first configuration at a first time instance, measuring a first voltage between chassis and the first node when the isolation resistance measurement circuit is in the first configuration, configuring the isolation resistance measurement circuit in a second configuration at a second time instance, and measuring a second voltage between chassis and the second node when the isolation resistance measurement circuit is in the second configuration, wherein determining the first isolation resistance comprises determining the first isolation resistance based on the first voltage, the second voltage, a power system voltage, and a resistance of the pole resistor, and wherein determining the second isolation resistance comprises determining the second isolation resistance based on the first voltage, the second voltage, the power system voltage, and the resistance of the pole resistor.

Example 6: The method of example 5, wherein the first isolation resistance equals: $-(R_0*V_1+R_0*V_2-R_0*V_b)/V_2$, wherein the second isolation resistance equals: $-(R_0*V_1+R_0*V_2-R_0*V_b)/V_1$, and wherein $R_0$ is the resistance of the pole resistor, $V_1$ is the first voltage, $V_2$ is the second voltage, and $V_b$ is the power system voltage.

Example 7: The method of any of examples 5 and 6, further comprising determining that the power system voltage changed from the first time instance to the second time instance, determining a first ratio between the first voltage and the power system voltage at the first time instance, and scaling at least one of the first voltage or the power system voltage based on the first ratio when determining the second isolation resistance, wherein at least one of the first voltage or the power system voltage used for determining the second isolation resistance is at least one of the scaled first voltage or the scaled power system voltage.

Example 8: An electric vehicle comprising a chassis, a power system comprising a first node and a second node, and an electrical control unit (ECU) comprising processing circuitry, wherein the processing circuitry is configured to determine a first isolation resistance between the first node of the power system and the chassis, determine a second isolation resistance between the second node of the power system and the chassis, determine that the first isolation resistance or the second isolation resistance is less than a threshold resistance, and output information based on the determination that the first isolation resistance or the second isolation resistance is less than the threshold resistance.

Example 9: The electric vehicle of example 8, wherein to output information, the processing circuitry is configured to output information indicating whether the first isolation resistance or the second isolation resistance or both are less than the threshold resistance.

Example 10: The electric vehicle of any of examples 8 and 9, wherein the first node is a positive node of the power system, and the second node is a negative node of the power system.

Example 11: The electric vehicle of any of examples 8 and 9, wherein the first node is a negative node of the power system, and the second node is a positive node of the power system.

Example 12: The electric vehicle of any of examples 8-11, wherein the processing circuitry is configured to configure an isolation resistance measurement circuit in a first configuration at a first time instance, measure a first voltage between chassis and the first node when the isolation resistance measurement circuit is in the first configuration, and configure the isolation resistance measurement circuit in a second configuration at a second time instance, and measure a second voltage between chassis and the second node when the isolation resistance measurement circuit is in the second configuration, wherein to determine the first isolation resistance, the processing circuitry is configured to determine the first isolation resistance based on the first voltage, the second voltage, a power system voltage, and a resistance of a pole resistor, and wherein to determine the second isolation resistance, the processing circuitry is configured to determine the second isolation resistance based on the first voltage, the second voltage, the power system voltage, and the resistance of the pole resistor.

Example 13: The electric vehicle of example 12, wherein the first isolation resistance equals: −(R0*V1+R0*V2−R0*Vb)/V2, wherein the second isolation resistance equals: −(R0*V1+R0*V2−R0*Vb)/V1, and wherein R0 is the resistance of the pole resistor, V1 is the first voltage, V2 is the second voltage, and Vb is the power system voltage.

Example 14: The electric vehicle of any of examples 12 and 13, wherein the processing circuitry is configured to determine that the power system voltage changed from the first time instance to the second time instance, determine a first ratio between the first voltage and the power system voltage at the first time instance, and scale at least one of the first voltage or the power system voltage based on the first ratio when determining the second isolation resistance, wherein at least one of the first voltage or the power system voltage used for determining the second isolation resistance is at least one of the scaled first voltage or the scaled power system voltage.

Example 15: A non-transitory computer-readable storage medium storing instructions thereon that when executed cause one or more processors to determine a first isolation resistance between a first node of a power system in an electrical vehicle (EV) and a chassis of the EV, determine a second isolation resistance between a second node of the power system in the EV and the chassis of the EV, determine that the first isolation resistance or the second isolation resistance is less than a threshold resistance, and output information based on the determination that the first isolation resistance or the second isolation resistance is less than the threshold resistance.

Example 16: The computer-readable storage medium of example 15, wherein the instructions that cause the one or more processors to output information comprise instructions that cause the one or more processors to output information indicating whether the first isolation resistance or the second isolation resistance or both are less than the threshold resistance.

Example 17: The computer-readable storage medium of any of examples 15 and 16, wherein the first node is a positive node of the power system, and the second node is a negative node of the power system.

Example 18: The computer-readable storage medium of any of examples 15 and 16, wherein the first node is a negative node of the power system, and the second node is a positive node of the power system.

Example 19: The computer-readable storage medium of any of examples 15-18, further comprising instructions that cause the one or more processors to configure an isolation resistance measurement circuit in a first configuration at a first time instance, measure a first voltage between chassis and the first node when the isolation resistance measurement circuit is in the first configuration, configure the isolation resistance measurement circuit in a second configuration at a second time instance, and measure a second voltage between chassis and the second node when the isolation resistance measurement circuit is in the second configuration, wherein the instructions that cause the one or more processors to determine the first isolation resistance comprise instructions that cause the one or more processors to determine the first isolation resistance based on the first voltage, the second voltage, a power system voltage, and a resistance of a pole resistor, and wherein the instructions that cause the one or more processors to determine the second isolation resistance comprise instructions that cause the one or more processors to determine the second isolation resistance based on the first voltage, the second voltage, the power system voltage, and the resistance of the pole resistor.

Example 20: The computer-readable storage medium of example 19, further comprising instructions that cause the one or more processors to determine that the power system voltage changed from the first time instance to the second time instance, determine a first ratio between the first voltage and the power system voltage at the first time instance, and scale at least one of the first voltage or the power system voltage based on the first ratio when determining the second isolation resistance, wherein at least one of the first voltage or the power system voltage used for determining the second isolation resistance is at least one of the scaled first voltage or the scaled power system voltage.

In one or more examples, the functions described may be implemented in hardware, software, firmware, or any combination thereof. If implemented in software, the functions may be stored as one or more instructions or code on a computer-readable medium. Computer-readable media may include computer data storage media. Data storage media may be any available media that can be accessed by one or more computers or one or more processors to retrieve instructions, code and/or data structures for implementation of the techniques described in this disclosure. By way of example, and not limitation, such computer-readable media can comprise random access memory (RAM), read-only memory (ROM), EEPROM, CD-ROM or other optical disk storage, magnetic disk storage or other magnetic storage devices, or any other medium that can be used to store desired program code in the form of instructions or data structures and that can be accessed by a computer. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The code may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor or processing circuitry," as used herein may refer to any of the foregoing structure or any other structure suitable for implementation of the techniques described herein. Also, the techniques could be fully implemented in one or more circuits or logic elements.

The techniques of this disclosure may be implemented in a wide variety of devices or apparatuses, including an integrated circuit (IC) or a set of ICs (i.e., a chip set). Various components, modules or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Various examples have been described. These and other examples are within the scope of the following claims.

The invention claimed is:
1. A method comprising:
configuring an isolation resistance measurement circuit in a first configuration at a first time instance;

measuring a first voltage between a chassis of an electrical vehicle (EV) and a first node of a power system in the EV when the isolation resistance measurement circuit is in the first configuration, wherein the power system in the EV is a voltage source of the EV;

configuring the isolation resistance measurement circuit in a second configuration at a second time instance;

measuring a second voltage between the chassis and a second node of the power system when the isolation resistance measurement circuit is in the second configuration;

determining a first isolation resistance between the first node of the power system and the chassis based on the first voltage, the second voltage, a voltage of the power system, and a resistance of a pole resistor;

determining that the voltage of the power system changed from the first time instance to the second time instance;

determining a first ratio between the first voltage and the voltage of the power system at the first time instance;

scaling at least one of the first voltage or the voltage of the power system based on the first ratio when determining a second isolation resistance;

determining the second isolation resistance between the second node of the power system and the chassis based on the first voltage, the second voltage, the voltage of the power system, and the resistance of the pole resistor, wherein at least one of the first voltage or the voltage of the power system used for determining the second isolation resistance is at least one of the scaled first voltage or the scaled voltage of the power system, respectively;

determining that the first isolation resistance or the second isolation resistance is less than a threshold resistance; and outputting information based on the determination that the first isolation resistance or the second isolation resistance is less than the threshold resistance.

2. The method of claim 1, wherein outputting information comprises outputting information indicating whether the first isolation resistance or the second isolation resistance or both are less than the threshold resistance.

3. The method of claim 1, wherein the first node is a positive node of the power system, and the second node is a negative node of the power system.

4. The method of claim 1, wherein the first node is a negative node of the power system, and the second node is a positive node of the power system.

5. The method of claim 1,
wherein the first isolation resistance equals:

$-(R0*V1+R0*V2-R0*Vb)/V2,$ wherein the second isolation resistance equals:

$-(R0*V1+R0*V2-R0*Vb)/V1,$ and wherein R0 is the resistance of the pole resistor, V1 is the first voltage, V2 is the second voltage, and Vb is the power system voltage.

6. A system comprising:
processing circuitry configured to:
configure an isolation resistance measurement circuit in a first configuration at a first time instance;
measure a first voltage between a chassis of an electrical vehicle (EV) and a first node of a power system in the EV when the isolation resistance measurement circuit is in the first configuration, wherein the power system in the EV is a voltage source of the EV;
configure the isolation resistance measurement circuit in a second configuration at a second time instance;
measure a second voltage between the chassis and a second node of the power system when the isolation resistance measurement circuit is in the second configuration;
determine a first isolation resistance between the first node of the power system and the chassis based on the first voltage, the second voltage, a voltage of the power system, and a resistance of a pole resistor;
determine that the voltage of the power system changed from the first time instance to the second time instance;
determine a first ratio between the first voltage and the voltage of the power system at the first time instance;
scale at least one of the first voltage or the voltage of the power system based on the first ratio when determining a second isolation resistance;
determine the second isolation resistance between the second node of the power system and the chassis based on the first voltage, the second voltage, the voltage of the power system, and the resistance of the pole resistor, wherein at least one of the first voltage or the voltage of the power system used for determining the second isolation resistance is at least one of the scaled first voltage or the scaled voltage of the power system, respectively;
determine that the first isolation resistance or the second isolation resistance is less than a threshold resistance; and
output information based on the determination that the first isolation resistance or the second isolation resistance is less than the threshold resistance.

7. The system of claim 6, wherein the system comprises the power system comprising the first node and the second node.

8. The system of claim 6, wherein the system is the EV comprising the chassis and the power system comprising the first node and the second node.

9. The system of claim 6, wherein to output information, the processing circuitry is configured to output information indicating whether the first isolation resistance or the second isolation resistance or both are less than the threshold resistance.

10. The system of claim 6, wherein the first node is a positive node of the power system and the second node is a negative node of the power system.

11. The system of claim 6, wherein the first node is a negative node of the power system and the second node is a positive node of the power system.

12. The system of claim 6,
wherein the first isolation resistance equals:

$-(R0*V1+R0*V2-R0*Vb)/V2,$ wherein the second isolation resistance equals:

$-(R0*V1+R0*V2-R0*Vb)/V1,$ and wherein R0 is the resistance of the pole resistor, V1 is the first voltage, V2 is the second voltage, and Vb is the power system voltage.

13. A non-transitory computer-readable storage medium storing instructions thereon that when executed cause one or more processors to:
configure an isolation resistance measurement circuit in a first configuration at a first time instance;
measure a first voltage between a chassis of an electrical vehicle (EV) and a first node of a power system in the EV when the isolation resistance measurement circuit is in the first configuration, wherein the power system in the EV is a voltage source of the EV;

configure the isolation resistance measurement circuit in a second configuration at a second time instance; and measure a second voltage between the chassis and a second node of the power system when the isolation resistance measurement circuit is in the second configuration;

determine a first isolation resistance between the first node of the power system and the chassis based on the first voltage, the second voltage, a voltage of the power system, and a resistance of a pole resistor;

determine that the voltage of the power system changed from the first time instance to the second time instance;

determine a first ratio between the first voltage and the voltage of the power system at the first time instance;

scale at least one of the first voltage or the voltage of the power system based on the first ratio when determining a second isolation resistance;

determine the second isolation resistance between the second node of the power system and the chassis based on the first voltage, the second voltage, the voltage of the power system, and the resistance of the pole resistor, wherein at least one of the first voltage or the voltage of the power system used for determining the second isolation resistance is at least one of the scaled first voltage or the scaled voltage of the power system, respectively;

determine that the first isolation resistance or the second isolation resistance is less than a threshold resistance; and output information based on the determination that the first isolation resistance or the second isolation resistance is less than the threshold resistance.

14. The computer-readable storage medium of claim 13, wherein the instructions that cause the one or more processors to output information comprise instructions that cause the one or more processors to output information indicating whether the first isolation resistance or the second isolation resistance or both are less than the threshold resistance.

* * * * *